Figure 1:
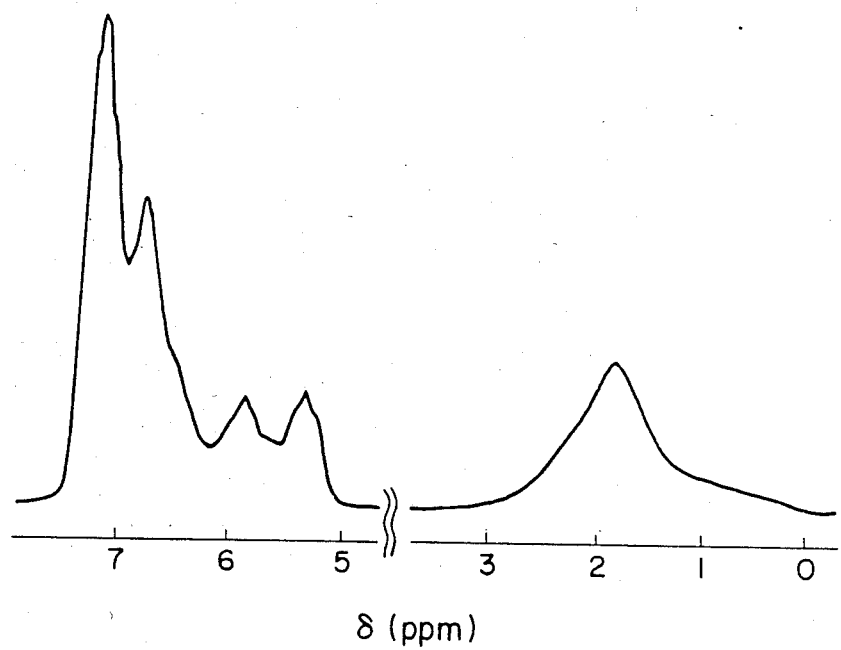

United States Patent [19]

Hatada et al.

[11] Patent Number: 4,559,389
[45] Date of Patent: Dec. 17, 1985

[54] GRAFT COPOLYMERS, PROCESS FOR THE PREPARATION THEREOF AND IONIZING RADIATION SENSITIVE RESIST USING SUCH COPOLYMERS

[75] Inventors: Koichi Hatada, Ikeda; Yoshio Okamoto, Amagasaki; Tatsuki Kitayama, Higashiosaka, all of Japan

[73] Assignee: Asahi Kasei Kogyo Kabushiki Kaisha, Osaka, Japan

[21] Appl. No.: 690,352

[22] Filed: Jan. 10, 1985

Related U.S. Application Data

[62] Division of Ser. No. 546,337, Oct. 28, 1983, Pat. No. 4,523,000.

[30] Foreign Application Priority Data

Nov. 2, 1982 [JP] Japan .................................. 57-193068
Dec. 1, 1982 [JP] Japan .................................. 57-210830

[51] Int. Cl.⁴ .................... C08L 257/00; C08L 257/02
[52] U.S. Cl. .................................. 525/250; 525/309; 525/310; 525/292
[58] Field of Search ......................... 525/250, 309, 310

[56] References Cited

U.S. PATENT DOCUMENTS 3,043,817  7/1962  Jahn et al. ............................ 526/336
3,493,636  2/1970  Grunin et al. ........................ 526/336

Primary Examiner—Carman J. Seccuro
Attorney, Agent, or Firm—Sprung Horn Kramer & Woods

[57] ABSTRACT

Solvent-soluble copolymers having a number average molecular weight of about 1,000 to about 1,000,000 and comprising recurring units of the following formulae (I) and (II) (case A) or recurring unit of the following formulae (I), (II) and (III) (case B) or solvent-soluble graft copolymers having a number average molecular weight of about 1,500 to about 2,000,000 and comprising recurring units of the following formulae (I), (II) and/or (II'), and (IV) (case C) or recurring units of the following formulae (I), (II) and/or (II'), (III) and (IV) (case D), said recurring units being combined to form the main alkylene chain, wherein in the cases A and B the amount of the formula (I) unit is about 3 to 60 mol % of the total amount of the whole units, and in the cases C and D the amount of the formula (I) unit is about 5 to 60 mol % of the total amount of the units of formulae (I), (II) and/or (II'), and (IV), and in the cases B and D the amount of the formula (III) unit is about 1 to 40 mol % of the total amount of the whole units, and in the cases C and D the amount of the side chains enclosed in brackets of the formula (IV) unit is at least about 10% by weight of the amount of the main chain, exclusive of the bracketed grafted side chains, of the graft copolymer:

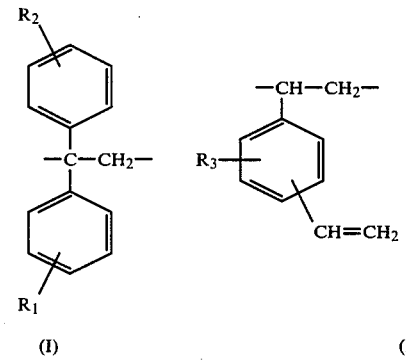

(I)                                          (II)

(II')                                        (III)

(Abstract continued on next page.)

-continued

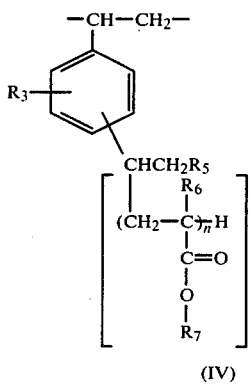

(IV)

wherein each of $R_1$, $R_2$ and $R_3$ represents independently hydrogen, a straight or branched chain alkyl group having 1 to 4 carbon atoms or a halogen; $R_4$ represents hydrogen or a straight or branched chain alkyl group having 1 to 10 carbon atoms; $R_5$ represents an alkyl group having 1 to 6 carbon atoms, a phenyl group or a benzyl group; $R_6$ represents hydrogen or a methyl group; $R_7$ represents a straight or branched chain alkyl group having 1 to 10 carbon atoms, an aryl group, an aralkyl group or an aminoalkyl group; and n is an integer of 1 to 50. A resist having an excellent sensitivity to ionizing radiations and a high resolution, and also having a high dry etching resistance is provided by using these copolymers and graft copolymers.

37 Claims, 2 Drawing Figures

GRAFT COPOLYMERS, PROCESS FOR THE PREPARATION THEREOF AND IONIZING RADIATION SENSITIVE RESIST USING SUCH COPOLYMERS

This is a division of application Ser. No. 546,337 filed Oct. 28, 1983 now U.S. Pat. No. 4,523,000.

This invention relates to copolymers obtained by copolymerizing 1,1-diphenylethylene or its derivative and divinylbenzene or its derivative, and it further relates to a process for preparing such copolymers and to an ionizing radiation sensitive resist using these copolymers.

It has been hardly possible to obtain a high molecular weight polymer from 1,1-diphenylethylene and its derivatives no matter what type of polymerization initiator is used for their polymerization, but it is known that a high molecular weight polymer can be obtained from styrene and its derivatives by copolymerizing them by using an anionic polymerization initiator such as butyllithium.

The present inventors have found that a novel copolymer having double bonds and the alkylene main chain with a pendant styrene group can be obtained from 1,1-diphenylethylene or its derivatives and a bifunctional divinylbenzene or its derivatives, which are generally D the alkylene main chain, in which the amount of the formula (I) unit is about 3 to about 60 mol % of the total amount of the units of the formulae (I) and (II):

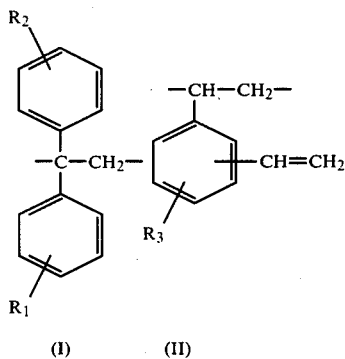

wherein each of $R_1$, $R_2$ and $R_3$ represents independently hydrogen, a straight or branched chain alkyl group having 1 to 4 carbon atoms or a halogen.

In another aspect, this invention provides a copolymer which, in addition to the units of formulae (I) and (II), may further contain a unit of the following formula (III):

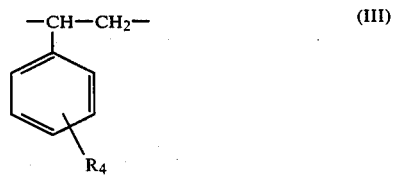

wherein $R_4$ is hydrogen or a straight or branched chain alkyl group having 1 to 10 carbon atoms, but in which the total amount of the units of formulae (I) and (II) is about 60 to about 99 mol % of the total amount of the whole units and the amount of the formula (I) unit is about 3 to about 60 mol %, preferably about 3 to about 50 mol % from the viewpoint of polymer synthesis, of the total amount of the units of formulae (I) and (II).

In still another aspect, this invention provides a solvent-soluble graft copolymer having a number average molecular weight of about 1,500 to about 2,000,000 and comprising the units of the formula (I), the formula (II) and/or the following formula (II'), and the following formula (IV):

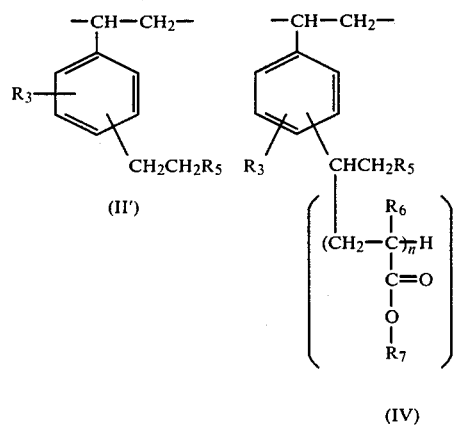

wherein $R_3$ is the same as defined above; $R_5$ is a straight or branched chain alkyl group having 1 to 6 carbon atoms, or a phenyl or benzyl group; $R_6$ is hydrogen or a methyl group; $R_7$ is a straight or branched chain alkyl group having 1 to 10 carbon atoms, an aryl group, an aralkyl group or an aminoalkyl group; and n is an integer of 1 to 50, in which the amount of the formula (I) unit is about 5 to about 60 mol % of the total amount of the units of formulae (I), (II) and/or (II'), and (IV) and the amount of the grafted side chains enclosed in the brackets of the unit of formula (IV) is at least 10% by weight, preferably about 50 to about 100% by weight, of the amount of the main chain, exclusive of said side chains, of the copolymer.

In a further aspect, this invention provides a solvent-soluble graft copolymer having a number average molecular weight of about 1,500 to about 2,000,000 and comprising the units of the formula (III) in addition to the units of the formulae (I), (II) and/or (II'), and (IV) in which the total amount of the units of the formulae (I), (II) and/or (II'), and (IV) is about 60 to about 99 mol % of the total amount of the whole units, the amount of the formula (III) unit is about 1 to about 40 mol % of the total amount of the whole units, the amount of the formula (I) unit is about 5 to about 60 mol % of the total amount of the units of the formulae (I), (II) and/or (II'), and (IV), and the amount of the side chains enclosed in the brackets of the formula (IV) unit is at least about 10% by weight, preferably about 50 to about 100% by weight, of the amount of the main chain, exclusive of said side chains, of the copolymer.

The above-defined numerical values of the units were determined for attaining the maximum development of the specificity of the novel copolymer and graft copolymer of this invention.

In the formula (I) unit, each of $R_1$ and $R_2$ represents independently hydrogen, a straight or branched chain alkyl group having 1 to 4 carbon atoms or a halogen. Examples of such alkyl group are methyl, ethyl, n-propyl, isopropyl, n-butyl, sec-butyl and tert-butyl and examples of the halogen are chlorine and bromine. Among them, hydrogen is preferred in this invention.

The groups —CH—CH$_2$, —CH$_2$CH$_2$R$_5$ and

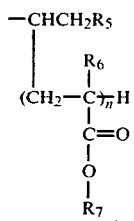

in the units of formulae (II), (II') and (IV) may be at any position in relation to the carbon atoms in the main chain, but it is preferable in view of the preparation of the objective copolymer or graft copolymer that said groups be at the meta- or para-position.

R$_3$ in the formula (II) unit represents hydrogen, a straight or branched chain alkyl group having 1 to 4 carbon atoms or a halogen. Examples of the alkyl group and halogen include those specifically mentioned above in relation to R$_1$ and R$_2$, among which hydrogen is preferred.

R$_4$ in the formula (III) unit represents hydrogen or a straight or branched chain alkyl group having 1 to 10 carbon atoms. Examples of such alkyl group include methyl, ethyl, n-propyl, isopropyl, n-butyl, isobutyl, sec-butyl, tert-butyl, n-pentyl, isopentyl, neopentyl, tert-pentyl, n-hexyl, isohexyl, tert-hexyl, n-octyl, isooctyl, n-nonyl, n-decyl, and the like, among which preferred are hydrogen, methyl, and ethyl.

R$_5$ in the units of formulae (II') and (IV) represents a straight or branched chain alkyl group having 1 to 6 carbon atoms, a phenyl group or a benzyl group. Examples of said alkyl group include methyl, ethyl, n-propyl, isopropyl, n-butyl, isobutyl, sec-butyl, tert-butyl, n-pentyl, isopentyl, neopentyl, tert-pentyl, n-hexyl, isohexyl, tert-hexyl, and the like. R$_6$ represents hydrogen or a methyl group, and R$_7$ represents a straight or branched chain alkyl group having 1 to 10 carbon atoms, an aryl group, an aralkyl group, or an aminoalkyl group. Examples of the alkyl group include methyl, ethyl, n-propyl, isopropyl, n-butyl, isobutyl, tert-butyl, n-pentyl, isopentyl, n-hexyl, 2-ethylhexyl, n-octyl, 2-ethyloctyl and the like. The aryl group includes phenyl and tolyl, the aralkyl group includes benzyl, and the aminoalkyl group includes N,N-dimethylaminoethyl, N,N-diethylaminoethyl, N,N-diisopropylaminoethyl, N-isopropylaminoethyl, and N-tert-butylaminoethyl.

The copolymers of this invention have a number average molecular weight ranging from about 1,000 to about 1,000,000, preferably about 1,000 to about 300,000, and the graft copolymers of this invention have a number average molecular weight ranging from about 1,500 to about 2,000,000.

The copolymers of this invention can be obtained by copolymerizing a mixture of at least one monomer represented by the following general formula (1) and at least one monomer represented by the following general formula (2), and, if necessary, at least one monomer represented by the following general formula (3) with an anionic polymerization initiator:

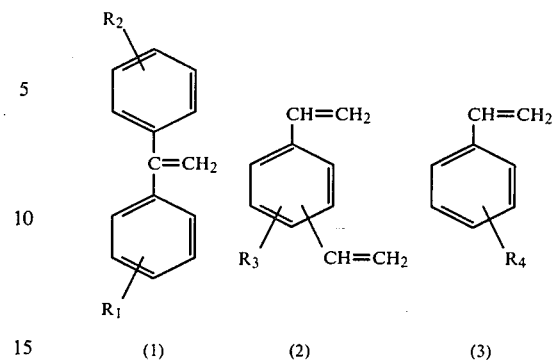

wherein R$_1$, R$_2$, R$_3$ and R$_4$ have the same meanings as defined above.

The monomer represented by the formula (1) includes 1,1-diphenylethylene, 1,1-di(methylphenyl)ethylene, 1,1-di(propylphenyl)ethylene, 1,1-di(butylphenyl)ethylene, 1,1-di(chlorophenyl)ethylene, and the like. These may be used alone or in admixture of two or more. Among them, 1,1-diphenylethylene is preferred.

The monomer represented by the formula (2) includes divinylbenzenes, divinyltoluenes, divinylethylbenzenes, divinylchlorobenzenes, and the like. In these divinyl compounds, the two vinyl groups may be at any of the ortho-, meta- and para-positions to each other. Commercially available divinyl compounds are often mixtures of them. Among the monomers, divinylbenzenes are preferable and m-divinylbenzene and p-divinylbenzene are more preferable.

The monomer represented by the formula (3) includes styrene, methylstyrenes, ethylstyrenes, n-propylstyrenes, n-butylstyrenes, tert-butylstyrenes, n-hexylstyrenes, 2-ethylhexylstyrenes, n-octylstyrenes and any mixtures thereof.

Further, in this invention, a part of the monomer represented by the formula (3) may be replaced by a styrene derivative such as a chlorostyrene, a chloromethylstyrene, an N,N-diethylaminoethylstyrene, or an N-isopropylaminoethylstyrene; an alkyl acrylate such as methyl acrylate, n-butyl acrylate, or 2-ethylhexyl acrylate; an alkyl methacrylate such as methyl methacrylate, n-butyl methacrylate, or n-octyl methacrylate; a vinyl monomer such as vinylpyridine, acrylonitrile, methacrylonitrile, vinylnaphthalenes or vinylanthracene; or any mixture thereof.

As the anionic polymerization initiator, alkyl metals may be used, among which alkyllithiums are preferred and include methyllithium, ethyllithium, n-propyllithium, isopropyllithium, n-butyllithium, sec-butyllithium, tert-butyllithium and the like. Of the alkyllithiums, ethyllithium, n-butyllithium, sec-butyllithium and tert-butyllithium are preferred because of easy availability.

The polymerization reaction can be performed in the presence of an inert medium which is inactive to the polymerization initiator and stable to both starting monomers and produced polymer. Examples of the inert media usable for the reaction of this invention include ethers such as diethyl ether, methyl ethyl ether, dibutyl ether and tetrahydrofuran; aromatic hydrocarbons such as benzene, toluene, xylene and ethylbenzene; and aliphatic hydrocarbons such as pentane, hexane, butane and cyclohexane.

The polymerization temperature is not critical, but a temperature of about 50° C. or less is preferable and the range of about −90° C. to about 30° C., is more preferable.

The polymerization time is neither critical, but usually a period of about one minute to about 48 hours is employed.

The ratios among the monomers of the formulae (1), (2) and (3) may be properly varied depending upon the composition of the copolymer to be produced and other matters.

The anionic polymerization initiator is used preferably in a molar ratio of about 0.0001 to about 0.1, more preferably about 0.0005 to about 0.01, per mol of the total amount of the monomers.

In case of using the inert medium, its amount is not critical, but the volume ratio of the medium to the whole monomers is preferably about 20/1 to about 1/1.

In the copolymer of this invention obtained by the anionic polymerization, each of the recurring units of the formulae (I), (II) and (III) may be arranged in the block form or at random. The arrangement of the recurring units can be adjusted by the method of feeding the starting monomers (for example, tap polymerization) or other means.

The following is a preferred embodiment of the polymerization method of this invention: The desired amount of a monomer of the formula (1) and a monomer of the formula (2), and if necessary, a monomer of the formula (3), are weighed, to which a required amount of an inert medium is then added, and the resulting mixture is charged into a reactor. The reactor is preferably purged with nitrogen. The reactants are heated or cooled to a predetermined temperature, a polymerization initiator is added thereto, and they are reacted with stirring for a predetermined period of time. After the polymerization reaction is completed, the reaction mixture is placed in a precipitation solvent such as methanol or the like to precipitate the produced copolymer, which is thereafter collected by filtration.

By the graft copolymerization of a monomer of the following formula (4):

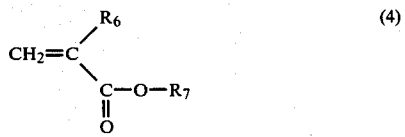

wherein $R_6$ is hydrogen or a methyl group, and $R_7$ is an alkyl group having 1 to 10 carbon atoms, an aryl group, an aralkyl group or an aminoalkyl group, on the side chain vinyl group of the copolymer comprising the units of the formulae (I) and (II) and, if necessary, the formula (III) unit of this invention, it is possible to produce a solvent-soluble copolymer comprising the units of the formulae (I), (II) and/or (II'), and (IV), and if necessary, the formula (III) unit.

The monomer used for this graft polymerization includes alkyl methacrylates, for example, methyl methacrylate, ethyl methacrylate, n-propyl methacrylate, isopropyl methacrylate, n-butyl methacrylate, isobutyl methacrylate, tert-butyl methacrylate, n-pentyl methacrylate, n-hexyl methacrylate, 2-ethylhexyl methacrylate, n-octyl methacrylate, 2-ethyloctyl methacrylate and the like; aryl methacrylates, for example, phenyl methacrylate, tolyl methacrylate and the like; aralkyl methacrylates, for example, benzyl methacrylate and the like; alkyl acrylates, for example, methyl acrylate, ethyl acrylate, n-propyl acrylate, isopropyl acrylate, n-butyl acrylate, isobutyl acrylate, tert-butyl acrylate, n-pentyl acrylate, n-hexyl acrylate, 2-ethlhexyl acrylate, n-octyl acrylate, 2-ethyloctyl acrylate and the like; aryl acrylates, for example, phenyl acrylate, tolyl acrylate and the like; aralkyl acrylates, for example, benzyl acrylate and the like; aminoalkyl methacrylates, for example, N,N-dimethylaminoethyl methacrylate, N,N-diethylaminoethyl methacrylate, N,N-diisopropylaminoethyl methacrylate, N-tert-butylaminoethyl methacrylate, N-isobutylaminoethyl methacrylate, and the like; and aminoalkyl acrylates, for example, N,N-dimethylaminoethyl acrylate, N,N-diethylaminoethyl acrylate, N,N-diisopropylaminoethyl acrylate, N-tert-butylaminoethyl acrylate, N-isobutylaminoethyl acrylate, and the like.

This graft copolymerization can be typically accomplished by dissolving a copolymer having the units of the formulae (I) and (II) and, if necessary, the formula (III) unit in an inert medium, adding an anionic polymerization initiator such as an organolithium to the resulting solution to anionize 100% of the pendent double bonds of the copolymer, inactivating a predetermined amount of the polymer anions formed with water or an alcohol such as methanol and subsequently graft copolymerizing at least one monomer of the formula (4) onto the remaining polymer anions.

According to another method, the graft copolymerization can be carried out by dissolving the copolymer of this invention in an inert medium, adding an anionic polymerization initiator such as an organolithium to the resulting solution in such an amount as to anionize part of the pendent double bonds of the copolymer to form polymer anions and subsequently graft copolymerizing at least one monomer of the formula (4) onto the polymer anions formed. According to this method, both the amount of the monomer grafted and the amount of the residual double bonds can be freely controlled.

According to a further method, the graft copolymerization can be carried out by continuing the procedures of the above-described second method. That is, after the graft copolymerization, an anionic polymerization initiator is added to the graft copolymer thus obtained in at least such an amount as to anionize the remaining part of the pendent double bonds of the graft copolymer to form polymer anions and then at least one monomer of the formula (4) is graft copolymerized onto the polymer anions formed.

According to a still further method, the graft copolymerization can be accomplished by a so-called one-pot method in which 1,1-diphenylethylene and a divinylbenzene and, if necessary, a styrene derivative are polymerized with an anionic polymerization initiator to produce a starting copolymer, a necessary amount of water or an alcohol such as methanol is added to inactivate the anions, a predetermined amount of an anionic polymerization initiator is added to anionize part or the entire of the double bonds to form polymer anions and subsequently at least one monomer of the formula (4) is graft copolymerized to the polymer anions formed.

The graft copolymerization according to the above described methods can be terminated by the addition of water or an alcohol such as methanol to inactivate the polymer anions in the grafted side chains.

The graft copolymerization of this invention is preferably carried out in an inert atmosphere such as nitrogen.

Typical examples of the anionic polymerization initiator used in this invention are organolithiums, among which alkyllithiums, phenyllithium and benzyllithium are preferred. As the alkyllithiums, there may be used methyllithium, ethyllithium, n-propyllithium, isopropyllithium, n-butyllithium, sec-butyllithium, n-pentyllithium and n-hexyllithium.

The reaction temperature is not critical, but the range of from about −90° C. to about 50° C. is preferred.

The reaction is preferably carried out in the presence of an inert medium. As the inert medium, there may be used ethers such as methyl ethyl ether, diethyl ether and tetrahydrofuran; aromatic hydrocarbons such as benzene, toluene and xylene; and aliphatic hydrocarbons such as pentane, hexane, heptane and cyclohexane.

This graft copolymerization can further improve the refractive index, solubility, hardening characteristics, wettability for the base material and adhesiveness of the copolymers of this invention.

The copolymers and draft copolymers of this invention are soluble in solvents, and these solvents include aromatic hydrocarbons such as benzene, toluene, ethylbenzene, diethylbenzene and xylene; ketones such as acetone, methyl ethyl ketone, methyl isobutyl ketone and methyl isoamyl ketone; acetates such as methyl acetate, ethyl acetate, isopropyl acetate, n-butyl acetate, n-amyl acetate, isoamyl acetate, ethylene glycol monomethyl ether acetate and ethylene glycol monoethyl ether acetate; ethers such as diethyl ether, dichloroethyl ether, dioxane and tetrahydrofuran; chlorinated hydrocarbons such as chloroform, tetrachloroethane and methylene chloride.

The copolymers and graft copolymers of this invention can be used as a resist having excellent properties by utilizing their curability upon irradiation with electron beams, X-rays or ultraviolet rays. Especially when they are used as a resist for fine fabrication for producing semiconductors, photomasks and the like, such resist shows a high sensitivity, high resolution and excellent dry etching resistance.

With high-degree integration of LSI, demand for resists to be used for fine fabrication is now increasing. Currently, PMMA [poly(methyl methacrylate)] is widely used as positive type resist. This PMMA resist has an excellent resolution, but its electron beam sensitivity is $5 \times 10^{-5}$ coulomb/cm$^2$ and its X-ray sensitivity is as low as about 500 mJ/cm$^2$. Thus, in the case of a conventional X-ray apparatus using this PMMA resist, about two hours are required for treating a sheet of wafer. Moreover, the positive type resist is disadvantageous in respect of dry etching resistance because of its liability to thermal decomposition.

Generally, the negative type resist has a higher sensitivity than the positive type resist. For example, PGMA [poly(glycidyl methacrylate)] shows an electron beam sensitivity of about $5 \times 10^{-6}$ coulomb/cm$^2$ and an X-ray sensitivity of about 10 mJ/cm$^2$, but is poor in dry etching resistance. Said negative type resist is also poor in resolution owing to its peculiar bridges or scum, and it is not easy to form a submicron pattern with such resist.

Thus, the positive type resist, although excellent in resolution, is defective in sensitivity and dry etching resistance, and the negative type resist, though excellent in sensitivity, is intolerably poor in resolution, and there is yet available no resist satisfying all of the required properties.

By using the copolymers and graft copolymers of this invention, it is possible to provide a resist having an excellent sensitivity ionizing radiations such as ultraviolet rays, deep ultraviolet rays, electron beams and X-rays and a high resolution, and also showing an excellent dry etching resistance.

A typical example of the method for forming a pattern by use of an ionizing radiation sensitive resist of this invention is shown below. First, a copolymer prepared according to this invention is dissolved in a suitable solvent, for example, a ketone solvent or an aromatic solvent, to prepare a resist solution. This resist solution is uniformly applied onto a semiconductor substrate or a mask base by a spinner or other means to form a coating resist film of a desired thickness, and after removing the residual solvent, the coating film is subjected to a prebaking treatment for increasing the adhesiveness to the substrate. Then the desired part of the resist film is exposed to an ionizing radiation such as electron beams or X-rays in a known manner and developed with a suitable developing solution such as an aromatic hydrocarbon solvent or an amide solvent. The non-exposed portion alone of the resist film is selectively dissolved away and the remaining portion is rinsed with a rinsing solution such as an alocholic solvent to form a resist pattern.

In the case of semiconductor substrate, this resist pattern is used as a mask and the exposed portion is dry-etched with CF$_4$ gas, argon gas or the like to form a pattern, and finally the resist film is ashed off by use of O$_2$ plasma or other means to obtain an etched semiconductor substrate.

Furthermore, it is possible to blend a cross-linkable monomer or polymer having a double bond with a copolymer or graft copolymer of this invention and to cross-link the copolymer or graft copolymer by applying an energy such as heat or light. Exemplary cross-linkable monomers include styrene, vinyltoluene, methyl methacrylate, vinylpyridine and the like, and exemplary cross-linkable polymers include diallyl phthalate polymers, unsaturated polyester resins, epoxy acrylates and the like.

Also, to the copolymer or graft copolymer of this invention may be added a hardening agent or a photosensitizer. Exemplary hardening agents which can be employed include radical hardening agents such as benzoyl peroxide and exemplary photosensitizers include benzophenones and benzophenone ethers.

Thus, the copolymers and graft copolymers according to this invention can be applied not only as a resist for semiconductors but also to a wider scope of uses, for example, as photosensitive resins, adhesives, surfactants, etc., by making use of their excellent curing and dissolving characteristics.

The present invention will be described in more detail below referring to Examples and the accompanying drawings which are, however, not to be interpreted as limiting the scope of the invention.

Figure 2:
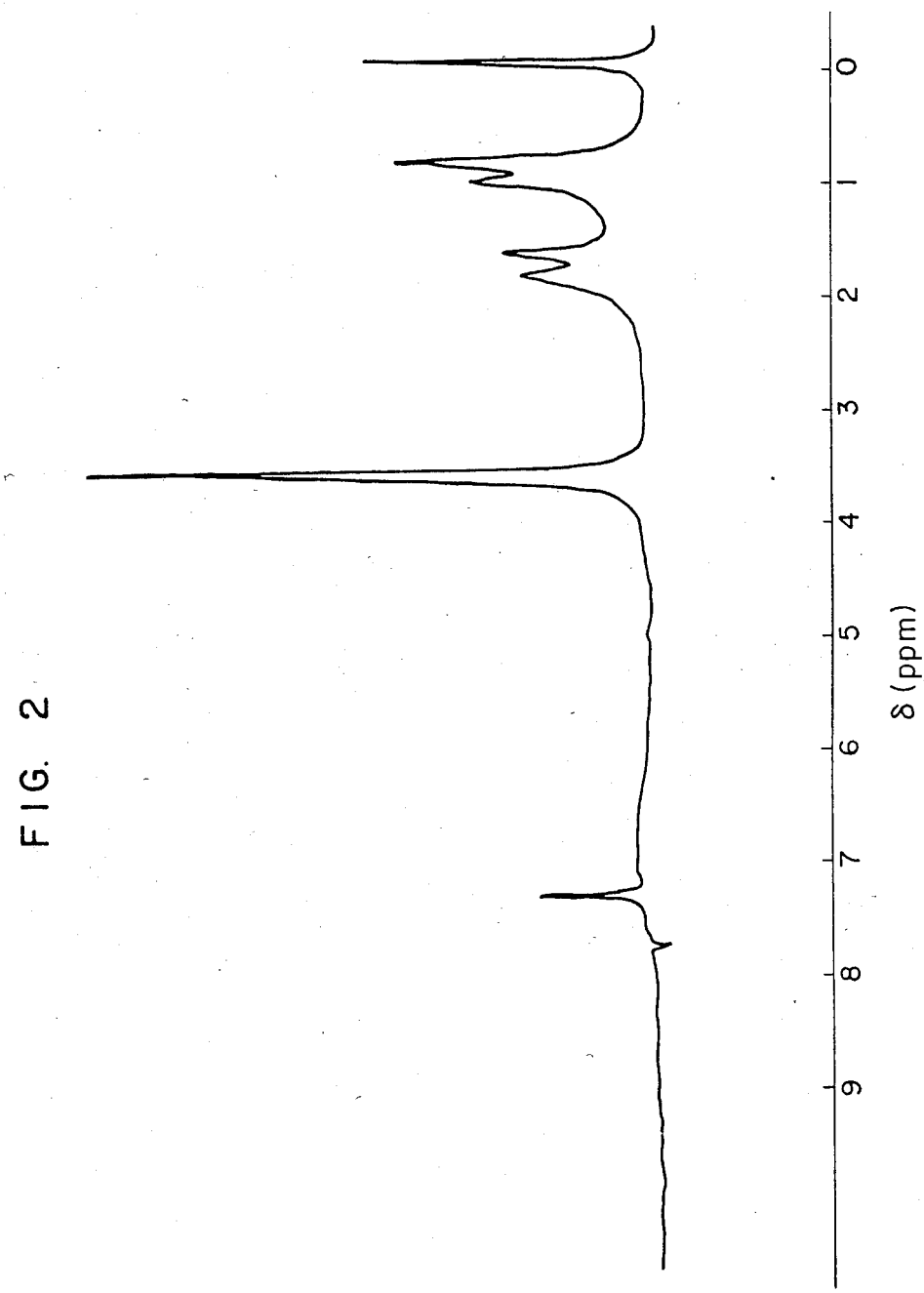

In the drawings, FIG. 1 shows an NMR spectrum of the copolymer of this invention obtained in Example 1, and FIG. 2 is an NMR spectrum of the copolymer of this invention obtained in Example 16.

EXAMPLE 1

Into a glass ampule having a three-way cock were charged 3.95 g (30.38 mmols) of meta-divinylbenzene, 10.40 g (57.79 mmols) of 1,1-diphenylethylene and 25 ml of dry tetrahydrofuran (THF) and after sufficient substitution of nitrogen for the air in the ampule, the ample was cooled to −20° C. in a low-temperature thermostatic bath. Then, 0.98 ml of a heptane solution of n-butyllithium (Conc.: 0.0917 mol/l.) was introduced into said ampule, and the resulting mixture was subjected to copolymerization at −20° C. for 24 hours. The reaction mixture was then placed in a large quantity of methanol and allowed to stand overnight. The precipitated reaction product (copolymer) was collected by filtration, washed with methanol, and dried at room temperature under reduced pressure to obtain a copolymer. The yield was 52.3% by weight. The number average molecular weight of the copolymer was 74,800 as measured by gel permeation chromatography.

The NMR spectrum of the product is shown in FIG. 1. From the phenyl group signal and the relative intensity ratio of methylene and methine proton in the main chain, it is apparent that 1,1-diphenylethylene was copolymerized. The molar ratio of meta-divinylbenzene and 1,1-diphenylethylene in the copolymer as calculated from this intensity ratio was 1.05/1. It is also found that 100% of the meta-divinylbenzene units in the copolymer had double bonds.

When 1,1-diphenylethylene alone was allowed to react under the same conditions, no polymer was produced. When the differential scanning calorimeter (DSC) curve of the homopolymer of meta-divinylbenzene was measured, an exothermic peak was observed at 157° C., but no such a peak was observed in the DSC curve of the product of the present Example.

EXAMPLE 2

A copolymer was synthetized in the same manner as in Example 1, except that 0.3 ml of a heptane solution of ethyllithium (0.25 mol/l.) was used as the polymerization initiator and the reaction temperature was −78° C. The details of the reaction conditions and the results are shown in Table 1.

EXAMPLE 3

Another copolymer was synthesized in the same manner as in Example 1, except that p-divinylbenzene and 1,1-diphenylethylene were used as the starting monomers and 0.99 ml of a heptane solution of n-butyllithium (0.0917 1 mol/l.) was used as the polymerization initiator. The results are shown in Table 1.

TABLE 1

|  | Example 2 | Example 3 |
|---|---|---|
| Divinylbenzene (DVB) | Meta-isomer, 1.30 g | Para-isomer, 2.68 g |

TABLE 1-continued

|  | Example 2 | Example 3 |
|---|---|---|
| Diphenylethylene (DPE) | 3.60 g | 12.04 g |
| Medium | THF, 25 ml | THF, 75 ml |
| Temperature | −78° C. | −20° C. |
| Time | 6 hrs. | 24 hrs. |
| Yield | 6% by wieght | 34.0% by weight |
| Polymer composition (DVB/DPE) | 1.38/1. | 1.43/1. |
| Number average molecular weight | 3,300 | 40,200 |
| Residual double bond percentage | 100% | 100% |

EXAMPLE 4

A copolymer was synthesized in the same manner as in Example 1, except that commercially aveilable divinylbenzene (manufactured by Sankyo Kasei and containing 39.3% by weight of meta-divinylbenzene, 17.4% by weight of para-divinylbenzene, 38.4% by weight of ethylvinylbenzene and 4.9% by weight of diethylbenzene) and 1,1-diphenylethylene were used as the starting monomers, 0.8 ml of a heptane solution of n-butyllithium (0.95 mol/l.) was used as the polymerization initiator and the reaction temperature was −78° C. The details of the reaction conditions and the results of the polymerization reaction are shown in Table 2.

TABLE 2

| Polymerization initiator | n-Butyllithium, 0.75 mmol |
|---|---|
| Commercially available divinylbenzene | 1.95 g |
| 1,1-Diphenylethylene (DPE) | 4.35 g (24.2 mmols) |
| Medium | Tetrahydrofuran, 15 ml |
| Polymerization temperature | −78° C. |
| Polymerization time | 48 hrs. |
| Yield | 33.6% by weight |
| NMR spectrum (δ value-integral value ratio) | 1 to 3–1.88; 5 to 6.2–1.00; 6.2 to 7.6–4.11 |
| Polymer composition | Divinylbenzene:diphenylethylene:ethylvinylbenzene = 1.28:1.00:0.17 (molar ratio) |
| Number average molecular weight | 2,900 |
| Residual double bond percentage | 100% |

EXAMPLES 5–14

Polymerization were conducted under the conditions that n-butyllithium was used as the initiator, 25 ml of tetrahydrofuran was used as the solvent, the reaction tempeature was −78° C. and the total amount of monomers was 30 mmols and under other conditions shown in Table 3, to obtain the results shown in Table 3.

TABLE 3

| Example No. | (1) | (2) | (1)/(2) (Molar ratio) | Polymerization initiator (mmol) | Polymerization time | Polymer yield (% by weight) | [DVB]/[DPE] molar ratio in polymer |
|---|---|---|---|---|---|---|---|
| 5 | 1,1-Diphenylethylene (DPE) | p-Divinylbenzene (DVB) | 2.75 | 0.06 | 2 mins. | 6.7 | 8.80/1 |
| 6 | 1,1-Diphenylethylene (DPE) | p-Divinylbenzene (DVB) | 0.93 | 0.09 | " | 9.8 | 3.24/1 |
| 7 | 1,1-Diphenylethylene (DPE) | p-Divinylbenzene (DVB) | 0.46 | 0.08 | " | 1.2 | 2.51/1 |
| 8 | 1,1-Diphenylethylene (DPE) | p-Divinylbenzene (DVB) | 0.33 | 0.07 | 12 mins. | 5.4 | 2.11/1 |
| 9 | 1,1-Diphenylethylene (DPE) | p-Divinylbenzene (DVB) | 0.18 | 0.06 | 20 mins. | 3.4 | 1.23/1 |
| 10 | 1,1-Diphenylethylene (DPE) | m-Divinylbenzene (DVB) | 2.00 | 0.04 | 7 mins. | 4.7 | 2.76/1 |

TABLE 3-continued

| Example No. | (1) | (2) | (1)/(2) (Molar ratio) | Polymerization initiator (mmol) | Polymerization time | Polymer yield (% by weight) | [DVB]/[DPE] molar ratio in polymer |
|---|---|---|---|---|---|---|---|
| 11 | 1,1-Diphenyl-ethylene (DPE) | m-Divinylbenzene (DVB) | 0.96 | 0.09 | 20 mins. | 0.3 | 2.10/1 |
| 12 | 1,1-Diphenyl-ethylene (DPE) | m-Divinylbenzene (DVB) | 0.51 | 0.08 | 6 hrs. | 5.3 | 1.67/1 |
| 13 | 1,1-Diphenyl-ethylene (DPE) | m-Divinylbenzene (DVB) | 0.33 | 0.07 | 19 hrs. | 5.1 | 1.26/1 |
| 14 | 1,1-Diphenyl-ethylene (DPE) | m-Divinylbenzene (DVB) | 0.19 | 0.06 | 24 hrs. | 2.8 | 1.20/1 |

EXAMPLE 15

A copolymer was synthesized in the same manner as in Example 1, except that 1.36 g (10.46 mmols) of meta-divinylbenzene, 6.32 g (30.38 mmols) of 1,1-di(p-methylphenyl)ethylene and 50 ml of dry tetrahydrofuran were used as the starting monomers. As a result, the dry yield was 35.7% by weight and the number average molecular weight of the copolymer obtained was 29.000(Mw/Mn=1.7).

EXAMPLE 16

In 60 ml of THF was dissolved 0.2 g of a copolymer of meta-divinylbenzene and 1,1-diphenylethylene (molar ratio: 1.19/1., number average molecular weight: 74,000) prepared by a method similar to that in Example 1, and the resulting solution was put into an ampule having a three-way cock. After sufficient substitution of nitrogen for the air in the ampule, the solution was cooled to −78° C. with dry ice-acetone, and 0.55 ml of sec-butyllithium (1.37 mols/l. heptane solution) was then added thereto. The resulting mixture was subjected to reaction for one hour. Then, 0.60 mmol of methanol was added thereto to inactivate 80% of the anions, followed by further addition of 0.28 g of methyl methacrylate. After reaction was conducted for one hour, the reaction was terminated by adding methanol and the reaction product was collected by filtration as a solid matter from a large amount of methanol. The dry weight of the product was 0.439 g.

The NMR spectrum of the product is shown in FIG. 2. It is apparent from this spectrum that the product contains poly(methyl methacrylate) chains. Also, from the fact that the product does not dissolve at all in acetonitrile in which the homopolymer of methyl methacrylate is soluble, this product was determined to be a graft copolymer. Its number average molecular weight was 162,000.

EXAMPLES 17–30

Similar experiments were carried out in the same manner as in Example 16 to obtain the results shown in Table 4.

TABLE 4

| Example No. | Starting polymer[a] Kind | Starting polymer[a] Weight | Number of millimoles of divinyl-benzene | Graft polymerization initiator (mmol) | Amount of methanol for anion control (mmol) | Monomer of structural formula (4) Kind[b] | Monomer of structural formula (4) Amount (mmol) | Polymerization conditions Temp. (°C.) | Polymerization conditions Time (hr) | Product Yield (g) | Product Grafting yield (% by weight) | Product Number average molecular weight |
|---|---|---|---|---|---|---|---|---|---|---|---|---|
| 17 | Copolymer of m-divinylbenzene and 1,1-diphenylethylene | 0.220 | 0.78 | sec-BuLi 0.78 | 0.00 | MMA | 2.83 | −78 | 0.33 | 0.377 | 26 | —[f] |
| 18 | Copolymer of p-di-[c]vinylbenzene and ethylene | 0.203 | 0.80 | 0.80 | 0.64 | " | 2.83 | " | 12 | 0.448 | 70 | 150,000 |
| 19 | Copolymer of m-divinylbenzene and 1,1-diphenyl-ethylene | 0.201 | 0.71 | 0.71 | 0.57 | " | 18.8 | " | 12 | 2.061 | 97 | —[f] |
| 20 | Copolymer of m-divinylbenzene and 1,1-diphenyl-ethylene | 0.204 | 0.73 | 0.73 | 0 | EMA | 4.81 | " | 6 | 0.510 | 49 | —[f] |
| 21 | Copolymer of m-divinylbenzene and 1,1-diphenyl-ethylene | 0.220 | 0.78 | 0.78 | 0.62 | " | 2.40 | " | 6 | 0.426 | 63 | 133,000 |
| 22 | Copolymer of m-divinylbenzene and 1,1-diphenyl-ethylene | 0.204 | 0.72 | 0.72 | 0 | BuMA | 1.76 | " | 24 | 0.459 | 86 | —[f] |
| 23 | Copolymer of m-divinylbenzene and 1,1-diphenyl-ethylene | 0.208 | 0.74 | 0.74 | 0.60 | " | 1.76 | " | 24 | 0.484 | 95 | 101,000 |
| 24 | Copolymer of m-divinylbenzene and 1,1-diphenyl-ethylene | 0.201 | 0.72 | 0.72 | 0 | t-BuMA | 1.76 | " | 12 | 0.368 | 51 | 98,000 |
| 25 | Copolymer of m- | 0.205 | 0.73 | 0.73 | 0.58 | " | 1.76 | " | 12 | 0.482 | 95 | 124,000 |

TABLE 4-continued

| Example No. | Starting polymer[a] Kind | Weight | Number of millimoles of divinylbenzene | Graft polymerization initiator (mmol) | Amount of methanol for anion control (mmol) | Monomer of structural formula (4) Kind[b] | A-mount (mmol) | Polymerization conditions Temp. (°C.) | Time (hr) | Product Yield (g) | Grafting yield (% by weight) | Number average molecular weight |
|---|---|---|---|---|---|---|---|---|---|---|---|---|
| | divinylbenzene and 1,1-diphenylethylene | | | | | | | | | | | |
| 26 | Copolymer of m-divinylbenzene and 1,1-diphenylethylene | 0.207 | 0.74 | 0.74 | 0.60 | BzMA | 1.42 | " | 24 | 0.503 | 100 | 131,000 |
| 27 | Copolymer of m-divinylbenzene and 1,1-diphenylethylene | 0.207 | 0.74 | 0.74 | 0.60 | t-BuMa BzMA | 0.80 0.78 | " | 24 | 0.511 | 100 | 188,000 |
| 28 | Copolymer of m-divinylbenzene and 1,1-diphenylethylene | 0.203 | 0.73 | 0.73 | 0.58 | MA | 3.33 | " | 24 | 0.278 | 21 | 82,300 |
| 29 | Copolymer of m-[d] divinylbenzene and 1,1-diphenylethylene | 0.203 | 0.73 | 0.36 | 0.22 | MMA | 3.77 | " | 2 | 0.516 | 77 | 106,000 |
| 30 | Copolymer of com-[e] mercially available divinylbenzene and 1,1-diphenylethylene | 0.201 | 0.76 | 0.76 | 0.61 | " | 2.83 | " | 24 | 0.282 | 24 | 74,400 |

Note:
[a]Dissolved in 60 ml of THF. The starting polymer used in Examples 17 and 19 to 28 was the same as used in Example 16.
[b]MA = methyl acrylate; MMA = methyl methacrylate; EMA = ethyl methacrylate; BuMA = n-butyl methacrylate; t-BuMA = t-butyl methacrylate; BzMA = benzyl methacrylate. MMA and EMA were added as they were, and others were added as a 50% (v/v) THF solution.
[c]p-DVB/DPE molar ratio in the polymer = 1.40/1; number average molecular weight = 109,700.
[d]m-DVB/DPE molar ratio in the polymer = 1.21/1; number average molecular weight = 42,700.
[e]DVB/DPE molar ratio in the polymer = 1.36/1; number average molecular weight = 62,100. Commercially available divinylbenzene containing 17.4% by weight of p-divinylbenzene, 39.3% by weight of m-divinylbenzene, 38.4% by weight of ethylstyrene and 4.9% by weight of diethylbenzene (manufactured by Sankyo Kasei).
[f]Not measured.

EXAMPLE 31

The copolymer obtained in Example 3 (para-divinylbenzene: 1,1-diphenylethylene=1.43:1, Mn=40,200, Mw/Mn=1.6) was dissolved in toluene to form a 10% solution and this solution was filtered through a 0.2 μm filter to prepare a resist solution. This resist solution was spin-coated on a silicon wafer at 3,000 r.p.m. and vacuum dried at 60° C. for 30 minutes to obtain a uniform coating film having a thickness of 1.0 μm. This was exposed in an electron beam exposing apparatus (ELS-3300 by ELIONIX) at an acceleration voltage of 20 KV with a varying exposure and line width to draw line-and-space patterns. The patterned wafer was taken out of the apparatus, immersed in methyl isobutyl ketone for 20 seconds, then spray washed to dissolve out the unexposed portion to develop the pattern image. This was further immersed in isopropyl alcohol for 30 seconds to rinse the image to obtain a resist pattern. This was subjected to post-baking at 150° C. for 30 minutes and film thickness was measured by a feeler method (with TALYSTEP-1 manufactured by TAYLOR-HOBSON) to examine the relation between exposed charge density and film thickness after development. Such an exposure ($D_g^{0.5}$) that the residual film thickness was one-half of the original film thickness was $5.0 \times 10^{-7}$ coulomb/cm$^2$, and its γ value was 2.1.

When the sections of the line-and-space pattern samples having different line widths obtained at an exposure of $5.0 \times 10^{-7}$ coulomb/cm$^2$ were observed by SEM (scanning electron microscope), there were seen sharp, 1-μm line-and-space rectangular sections, and it was found that these samples had a resolution of 1 μm or less.

Similar measurement of the commercially available resists for comparison showed that the PMMA-based OEBR-1000 ® (mfd. by Tokyo Ohka) had a sensitivity of $5 \times 10^{-4}$ coulomb/cm$^2$ and a γ value of 3.0 while the negative type resist OEBR-100 ® (mfd. by Tokyo Ohka, PGMA-based) showed a sensitivity of $4.5 \times 10^{-6}$ coulomb/cm$^2$ and a γ value of 1.6.

In order to examine the dry etching resistance of this copolymer, a coating film was formed on a silicon wafer in the same manner as described above and the coating film was exposed by irradiation with deep ultraviolet rays at a rate of 10 mJ/cm$^2$ (using Deep UV lamp UXM-500MX mfd. by Ushio Electric) and then subjected to reactive spattering (under the conditions of 0.05 Torr, 13.65 MHz and 200 W, using a mixed gas of 95% of CF$_4$ and 5% of O$_2$). The result showed that the etching speed was 400 Å/min, which was about ⅓ of the etching speed (1,200 Å/min) of the polysilicon substrate and equal to about 70% of the etching speed (580 Å/min) of the commercially available resist AZ-1350J (SHIPLEY).

EXAMPLE 32

The graft copolymer obtained in Example 16 was evaluated as a resist by the same method as in Example 31. As a result, it showed a sensitivity of $2.1 \times 10^{-6}$ coulomb/cm$^2$ and a γ value of 3.2

What is claimed is:

1. A solvent-soluble graft copolymer having a number average molecular weight of about 1,500 to about 2,000,000 and comprising recurring units represented by the following formulae (I), (II) and/or (II'), and (IV), said recurring units being combined to form the main alkylene chain, in which the amount of the formula (I)

unit is about 5 to about 60 mol % of the total amount of the units of the formulae (I), (II) and/or (II'), and (IV), and the amount of the grafted side chains in the brackets of the formula (IV) is at least about 10% by weight of the amount of the main chain of the graft copolymer exclusive of said side chains:

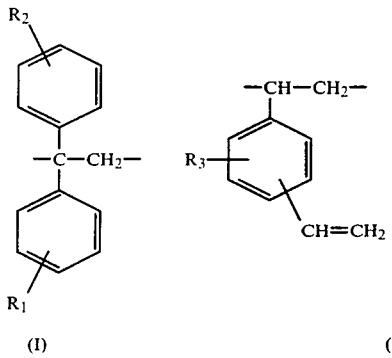

(I)   (II)

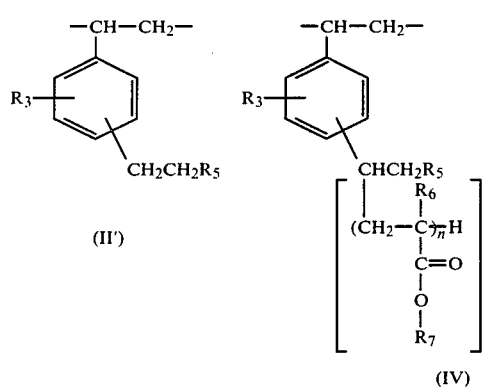

(II')   (IV)

wherein $R_1$, $R_2$ and $R_3$ represents independently hydrogen, a straight or branched chain alkyl group having 1 to 4 carbon atoms or halogen; $R_5$ is a straight or branched chain alkyl group having 1 to 6 carbon atoms, a phenyl group or a benzyl group; $R_6$ is hydrogen or a methyl group; $R_7$ is a straight or branched chain alkyl group having 1 to 10 carbon atoms, an aryl group, an aralkyl group or an aminoalkyl group; and n is an integer of 1 to 50.

2. The graft copolymer according to claim 1, wherein each of $R_1$, $R_2$ and $R_3$ is hydrogen.

3. The graft copolymer according to claim 1, wherein $R_5$ is an ethyl group, a n-butyl group or a sec-butyl group.

4. The graft copolymer according to claim 2, wherein $R_5$ is an ethyl group, a n-butyl group or a sec-butyl group.

5. The graft copolymer according to claim 1, wherein $R_6$ is hydrogen.

6. The graft copolymer according to claim 1, wherein $R_6$ is a methyl group.

7. The graft copolymer according to claim 5, wherein $R_7$ is a methyl group, an ethyl group, a n-butyl group, a tert-butyl group, a benzyl group or an N,N-dimethylaminoethyl group.

8. The graft copolymer according to claim 6, wherein $R_7$ is a methyl group, an ethyl group, a n-butyl group, a tert-butyl group, a benzyl group or an N,N-dimethylaminoethyl group.

9. The graft copolymer according to claim 1, wherein the groups $-CH=CH_2$, $-CH_2CH_2R_5$ and

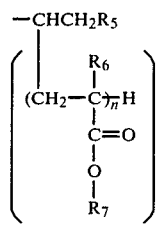

in the formulae (II), (II') and (IV) are at the meta- or para-position in relation to the carbon atoms in the main chain.

10. The graft copolymer according to claim 1, wherein the amount of the grafted side chains in the brackets of the formula (IV) is about 50 to about 100% by weight of the amount of the main chains of the graft copolymer exclusive of said side chains.

11. A solvent-soluble graft copolymer having a number average molecular weight of about 1,500 to about 2,000,000 and comprising recurring units represented by the following formulae (I), (II) and/or (II'), (III), and (IV), said recurring units being combined to form the main alkylene chain, in which the total amount of the units of the formulae (I), (II) and/or (II'), and (IV) is about 60 to about 99 mol % of the total amount of the whole units, the amount of the formula (III) unit is about 1 to about 40 mol % of the total amount of the whole units, the amount of the formula (I) unit is about 5 to about 60 mol % of the total amount of the units of the formulae (I), (II) and/or (II'), and (IV), and the amount of the grafted side chains in the brackets of the formula (IV) is at least about 10% by weight of the amount of the main chain of the graft copolymer exclusive of said side chains:

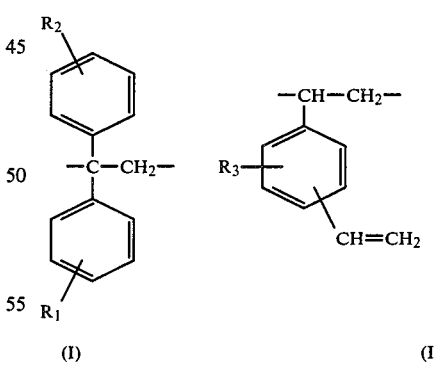

(I)   (II)

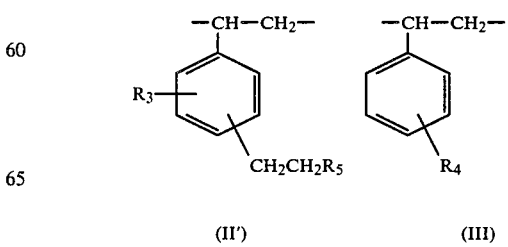

(II')   (III)

-continued

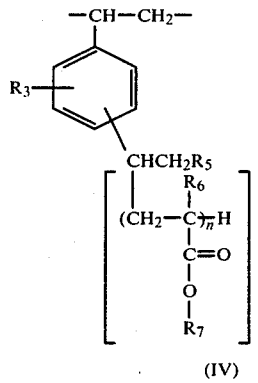

wherein $R_1$, $R_2$, $R_3$, $R_5$, $R_6$, $R_7$ and n have the same meanings as defined in claim 1, and $R_4$ is hydrogen or a straight or branched chain alkyl group having 1 to 10 carbon atoms.

12. The graft copolymer according to claim 11, wherein each of $R_1$, $R_2$ and $R_3$ is hydrogen.

13. The graft copolymer according to claim 11, wherein $R_4$ is hydrogen, a methyl group or an ethyl group.

14. The graft copolymer according to claim 11, wherein $R_5$ is an ethyl group, a n-butyl group or a sec-butyl group.

15. The graft copolymer according to claim 12, wherein $R_5$ is an ethyl group, a n-butyl group or a sec-butyl group.

16. The graft copolymer according to claim 11, wherein $R_6$ is hydrogen.

17. The graft copolymer according to claim 11, wherein $R_6$ is a methyl group.

18. The graft copolymer according to claim 16, wherein $R_7$ is a methyl group, an ethyl group, a n-butyl group, a tert-butyl group, a benzyl group or an N,N-dimethylaminoethyl group.

19. The graft copolymer according to claim 17, wherein $R_7$ is a methyl group, an ethyl group, a n-butyl group, a tert-butyl group, a benzyl group or an N,N-dimethylaminoethyl group.

20. The graft copolymer according to claim 11, wherein the groups —CH=CH$_2$, —CH$_2$CH$_2$R$_5$ and

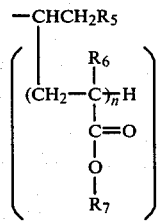

in the formulae (II), (II') and (IV) are at the meta- or para-position in relation to the carbon atoms in the main chain.

21. The graft copolymer according to claim 11, wherein the amoung of the grafted side chains in the brackets of the formula (IV) is about 50 to about 100% by weight of the amount of the main chains of the graft copolymer exclusive of said side chains.

22. The process for producing the graft copolymer as claimed in claim 1, which comprises graft copolymerizing at least one monomer of the following formula (4):

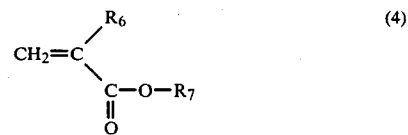

wherein $R_6$ is hydrogen or a methyl group and $R_7$ is a straight or branched chain alkyl group having 1 to 10 carbon atoms, an aryl group, an aralkyl group or an aminoalkyl group, onto the copolymer as claimed in claim 1 in the presence of an anionic polymerization initiator.

23. The process according to claim 22, wherein the anionic polymerization initiator is an organolithium.

24. The process according to claim 23, wherein the organolithium is an alkyllithium, phenyllithium or benzyllithium.

25. The process according to claim 24, wherein the alkyllithium is n-butyllithium or sec-butyllithium.

26. The process according to claim 22, wherein the graft copolymerization is carried out in the presence of an inert medium.

27. The process according to claim 26, wherein the inert medium is tetrahydrofuran.

28. The process according to claim 22, wherein the graft copolymerization is conducted at a temperature of about −90° C. to about 50° C.

29. The process for producing the graft copolymer as claimed in claim 11, which comprises graft copolymerizing at least one monomer of the following formula (4):

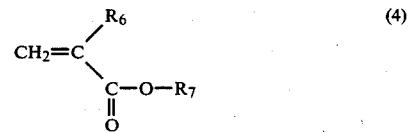

wherein $R_6$ is hydrogen or a methyl group and $R_7$ is a straight or branched chain alkyl group having 1 to 10 carbon atoms, an aryl group, an aralkyl group or an aminoalkyl group, onto the copolymer as claimed in claim 10 in the presence of an anionic polymerization initiator.

30. The process according to claim 29, wherein the anionic polymerization initiator is an organolithium.

31. The process according to claim 30, wherein the organolithium is an alkyllithium, phenyllithium or benzyllithium.

32. The process according to claim 31, wherein the alkyllithium is n-butyllithium or sec-butyllithium.

33. The process according to claim 29, wherein the graft copolymerization is carried out in the presence of an inert medium.

34. The process according to claim 33, wherein the inert medium is tetrahydrofuran.

35. The process according to claim 24, wherein the graft copolymerization is conducted at a temperature of about −90° C. to about 50° C.

36. An ionizing radiation sensitive resist comprising the graft copolymer as claimed in claim 1.

37. An ionizing radiation sensitive resist comprising the graft copolymer as claimed in claim 11.

* * * * *